US009793683B2

(12) United States Patent
Chiu et al.

(10) Patent No.: US 9,793,683 B2
(45) Date of Patent: Oct. 17, 2017

(54) DIGITAL PULSE WIDTH MODULATION POWER SUPPLY WITH PICO SECOND RESOLUTION

(71) Applicant: VueMetrix, Inc, Santa Clara, CA (US)

(72) Inventors: Jim Tark Chiu, Los Altos, CA (US); Paul Cornelius, Mt. View, CA (US)

(73) Assignee: Vuemetrix, Inc., Santa Clara, CA (US)

( * ) Notice: Subject to any disclaimer, the term of this patent is extended or adjusted under 35 U.S.C. 154(b) by 0 days.

(21) Appl. No.: 15/241,984

(22) Filed: Aug. 19, 2016

(65) Prior Publication Data

US 2017/0054272 A1    Feb. 23, 2017

Related U.S. Application Data

(60) Provisional application No. 62/208,442, filed on Aug. 21, 2015.

(51) Int. Cl.
*H01S 5/42* (2006.01)
*H01S 5/042* (2006.01)
*H01S 5/062* (2006.01)
*H01S 5/40* (2006.01)

(52) U.S. Cl.
CPC ........ *H01S 5/0428* (2013.01); *H01S 5/06216* (2013.01); *H01S 5/4018* (2013.01)

(58) Field of Classification Search
CPC .............................. H01S 5/0428; H01S 5/4018
See application file for complete search history.

(56) References Cited

U.S. PATENT DOCUMENTS

| | | |
|---|---|---|
| 4,484,331 A | 11/1984 | Miller |
| 5,432,693 A | 7/1995 | Anderson |
| 5,498,973 A | 3/1996 | Cavaliere et al. |
| 6,580,735 B1 | 6/2003 | Theodoras, II |
| 6,797,936 B1 | 9/2004 | Kessler et al. |
| 7,202,651 B2 | 4/2007 | Chapuis |
| 2005/0041707 A1 | 2/2005 | Mangano |
| 2010/0254249 A1* | 10/2010 | Fujiie ............... B82Y 10/00 369/121 |

OTHER PUBLICATIONS

Horowitz & Hill, The Art of Electronics, Second Edition, pp. 229-230.

(Continued)

*Primary Examiner* — Dung Nguyen
(74) *Attorney, Agent, or Firm* — Haverstock & Owens LLP

(57) ABSTRACT

A laser system includes a laser generation element and a pulse width modulated (PWM) signal generator that uses a clock to generate a control signal having a period based on the clock frequency and includes a pulse width between a rising edge and a falling edge. The system also includes a switch mode power supply controlled by the control signal output by the PWM signal generator for providing power to the laser generation element based on the control signal. Also, the system includes a signal modification circuit that selectively delays the rising edge of each period of the control signal by one of one or more selectable durations thereby reducing the pulse width by a quantity, wherein the quantity is smaller than a minimum increment amount that the pulse width is able to change based on the clock frequency.

23 Claims, 4 Drawing Sheets

(56) References Cited

OTHER PUBLICATIONS

"High-Density Laser Diode Controller," Photonics, Model 8016, URL: www.newport.com/file.store/PDFs/tempPDFs/Model_80lb_HighDensity2827.pdf, pp. 9-13.
"Laser Diode Burn-In and Life Test Systems—Butterfly Devices," Photonics, URL: www.newport.com/file_store/PDFs/tempPDFs/Laser_Diode_BurnIn4004.pdf, pp. 2-3.
"Multiple Channel Laser Diode Characterization Systems," Photonics, URL: www.newport.com/file_store/PDFs/tempPDFs/Multiple_Channel2848_pdf, pp. 66-67.
"Integrating Sphere Optical Power Measurement Systems," URL: www.newport.com,p. 3-30.
"Laser Diode Autobar Test & Characterization System,"Newport, pp. 8-3-8-4.

\* cited by examiner

DIGITAL PULSE WIDTH MODULATION POWER SUPPLY WITH PICO SECOND RESOLUTION

RELATED APPLICATION(S)

This patent application claims priority under 35 U.S.C. §119(e) of the co-pending, co-owned U.S. Provisional Patent Application No. 62/208,442, filed Aug. 21, 2015, and entitled "DIGITAL PWM LASER POWER SUPPLY WITH PICO SECOND RESOLUTION" which is also hereby incorporated by reference in its entirety.

FIELD OF THE INVENTION

The present invention relates to the field of laser diodes. More particularly, the present invention relates to a laser diode controller power supply.

BACKGROUND OF THE INVENTION

Conventional digital pulse width modulated (PWM) power supplies work well for ordinary electronic devices that require a voltage source and are able to tolerate large voltage periodic and random deviation (PARD). In contrast, lasers require a current source wherein deviation in this current source manifests itself in the laser light output as a function of the periodic and random deviation of the power supply divided by the dynamic impedance of the laser. These effects on the output light are especially acute with diode lasers.

Digital PWM power supply output voltage is governed by the equation:

$$V\text{out}=D*V\text{in}; \quad (1)$$

where Vout is the output voltage and Vin is the input voltage. D is the duty cycle of the PWM. In the case of a digital PWM duty cycle is defined by the equation:

$$(n*\text{Clock})/(m*\text{Clock}); \quad (2)$$

where Clock is the time base of the microprocessor. Thus, (m*Clock) is the period of the switching frequency of the power supply and the (n/m) is the duty cycle D. Further, because both n and m are integers, (1/m)*clock is the smallest control increment. In other words, (1/m)*clock is the smallest increment that the pulse width is able to be adjusted based on the clock. This smallest increment is governed by the equation:

$$[n-(n-1)]/m. \quad (3)$$

For example, in the case of a 12 volt power supply controlled by a microprocessor with a 10 Mhz clock to drive a single 10 watt laser, a single clock cycle change will result in an incremental change of $10^{-7}$ seconds. The switch frequency of 100 Khz power supply is $10^{-5}$ seconds. From equation (3) the smallest incremental control change is $10^{-2}$. Based on this equation, the smallest adjustment a digital PWM laser controller is able to achieve can be calculated. A typical 10 watt diode laser's dynamic impedance is 0.04 ohm and the incremental change in light power is about one watt per one incremental ampere change. Using Ohms law (voltage=current*resistance) to control the output current from 0 to 10 amps 0.4 volts output change is needed. As indicated earlier the smallest incremental adjustment is 0.12 volts. This will result in 10*(0.12/0.4) amps or 3 amps.

Thus, for applications that require regulation better than a 30% increment, an improved method is needed. To reduce the amount of laser PARD, dither has been used to attempt to reduce the smallest incremental step. Dithering means alternately changing the duty cycle. To get 85% duty cycle the microprocessor alternately changes the duty cycle from 90% and 80%. However, the trade off requires the power supply to have a output smoothing filter ten times larger than necessary. This is not a cost effective trade off as a linear PWM IC could be less expensive than a low frequency power filter.

SUMMARY OF THE INVENTION

A laser diode control system has a PWM signal generator controlling a switched mode power converter that powers a laser generation element. The system further includes a signal modification circuit that enables the PWM signal to be modified such that smaller incremental changes to the pulse width are able to be made. As a result, the system is able to provide a smaller (e.g. pico) size granularity control over the PWM signal beyond what is possible solely using the clock of the PWM signal generator.

A first aspect is directed to a laser system. The laser system comprises a laser generation element, a pulse width modulated (PWM) signal generator including a clock having a clock frequency, wherein the PWM signal generator uses the clock to generate a control signal having a period based on the clock frequency and including a pulse width between a rising edge and a falling edge, switch mode power supply controlled by the control signal output by the PWM signal generator and electrically coupled to the laser generation element for providing power to the laser generation element based on the control signal and signal modification circuit electrically coupled with the PWM signal generator, wherein the signal modification circuit is configured to selectively delay the rising edge of each period of the control signal by one of one or more selectable durations thereby reducing the pulse width by a quantity, wherein the quantity is smaller than a minimum increment amount that the pulse width is able to change based on the clock frequency. In some embodiments, the signal modification circuit comprises a resistor-capacitor (RC) circuit electrically coupled with a controller that is configured to selectively adjust at least one of the resistance and the capacitance of the RC circuit. In some embodiments, the RC circuit comprises a plurality of resistors in parallel and the controller selectively adjusts the resistance by only providing power to a selected subset of the plurality of resistors. In some embodiments, the RC circuit comprises a plurality of capacitors and the controller selectively adjust the capacitance by only electrically coupling a selected subset of the capacitors to the resistance. In some embodiments, the PWM signal generator and the controller are integrated into a single microprocessor. In some embodiments, the laser generation element is a plurality of laser diodes coupled in series, thereby forming a laser diode series. In some embodiments, the PWM signal generator, the switch mode power supply and the signal modification circuit together form a power circuit having an output current, the laser system further comprising one or more additional power circuits that match the power circuit and each have a corresponding additional output current, wherein the output current and the additional output currents are all coupled in parallel and together provided to the to the laser generation element such that the current produced by the power circuit and the additional power circuits provided to the laser generation element is summed together. In some embodiments, one realization of the signal modification circuit or PWM modifying circuit comprises a switch having a gate terminal, a source terminal and a drain terminal, wherein one or more capacitors of the RC circuit are electrically coupled in parallel with the switch between the source and drain terminals, one or more resistors of the RC circuit are electrically coupled in series with the switch via the source terminal, and the output of the PWM signal generator is coupled to the gate terminal of the switch.

Another aspect is directed to a method of generating power for a laser system. The method comprises providing a laser generation element, generating a control signal using a clock of a pulse width modulated (PWM) signal generator, the clock having a clock frequency and the control signal having a period based on the clock frequency and including a pulse width between a rising edge and a falling edge, providing power to the laser generation element based on the control signal with a switch mode power supply controlled by the control signal output by the PWM signal generator and electrically coupled to the laser generation element and selectively delaying the rising edge of each period of the control signal by one of one or more selectable durations thereby reducing the pulse width by a quantity with a signal modification circuit electrically coupled with the PWM signal generator, wherein the quantity is smaller than a minimum increment amount that the pulse width is able to change based on the clock frequency. In some embodiments, the signal modification circuit comprises a resistor-capacitor (RC) circuit electrically coupled with a controller, the method further comprising selectively adjusting at least one of the resistance and the capacitance of the RC circuit with the controller. In some embodiments, the RC circuit comprises a plurality of resistors in parallel, the method further comprising selectively adjusting the resistance with the controller by only providing power to a selected subset of the plurality of resistors. In some embodiments, the RC circuit comprises a plurality of capacitors, the method further comprising selectively adjusting the capacitance with the controller by only electrically coupling a selected subset of the capacitors to the resistance. In some embodiments, the PWM signal generator and the controller are integrated into a single microprocessor. In some embodiments, the laser generation element is a plurality of laser diodes coupled in series, thereby forming a laser diode series. In some embodiments, the PWM signal generator, the switch mode power supply and the signal modification circuit together form a power circuit having an output current, the method further comprising providing one or more additional power circuits that match the power circuit and each have a corresponding additional output current, wherein the output current and the additional output currents are all coupled in parallel and providing all of the output currents to an input of the to the laser generation element such that the current produced by the power circuit and the additional power circuits provided to the laser generation element is summed together at the laser generation element and provides the summed current to the laser generation element. In some embodiments, the signal modification circuit comprises a switch having a gate terminal, a source terminal and a drain terminal, wherein one or more capacitors of the RC circuit are electrically coupled in parallel with the switch between the source and drain terminals, one or more resistors of the RC circuit are electrically coupled in series with the switch via the source terminal, and the output of the PWM signal generator is coupled to the gate terminal of the switch.

Yet another aspect is directed to a power circuit for powering a laser generator. The power circuit comprises a pulse width modulated (PWM) signal generator including a clock having a clock frequency, wherein the PWM signal generator uses the clock to generate a control signal having a period based on the clock frequency and including a pulse width between a rising edge and a falling edge and signal modification circuit electrically coupled with the PWM signal generator, wherein the signal modification circuit is configured to selectively delay the rising edge of each period of the control signal by one of one or more selectable durations thereby reducing the pulse width by a quantity, wherein the quantity is smaller than a minimum increment amount that the pulse width is able to change based on the clock frequency. In some embodiments, the signal modification circuit comprises a resistor-capacitor (RC) circuit electrically coupled with a controller that is configured to selectively adjust at least one of the resistance and the capacitance of the RC circuit. In some embodiments, the RC circuit comprises a plurality of resistors in parallel and the controller selectively adjusts the resistance by only providing power to a selected subset of the plurality of resistors. In some embodiments, the RC circuit comprises a plurality of capacitors and the controller selectively adjust the capacitance by only electrically coupling a selected subset of the capacitors to the resistance. In some embodiments, the PWM signal generator and the controller are integrated into a single microprocessor. In some embodiments, the PWM signal generator, the switch mode power supply and the signal modification circuit together form a power circuit having an output current, the laser system further comprising one or more additional power circuits that match the power circuit and each have a corresponding additional output current, wherein the output current and the additional output currents are all coupled in parallel such that the currents produced by the power circuit and the additional power circuits are summed together. In some embodiments, the signal modification circuit comprises a switch having a gate terminal, a source terminal and a drain terminal, wherein one or more capacitors of the RC circuit are electrically coupled in parallel with the switch between the source and drain terminals, one or more resistors of the RC circuit are electrically coupled in series with the switch via the source terminal, and the output of the PWM signal generator is coupled to the gate terminal of the switch.

DETAILED DESCRIPTION OF THE EMBODIMENTS

Embodiments of the present invention are directed to a laser diode control system having PWM signal generator controlling a switched mode power converter that powers a laser generation element. The system further includes a signal modification circuit that enables the PWM signal to be modified such that smaller incremental changes to the pulse width are able to be made. As a result, the system is able to provide a smaller (e.g. pico) size granularity control over the PWM signal beyond what is possible, solely using the clock of the PWM signal generator.

Reference will now be made in detail to implementations of the present invention as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
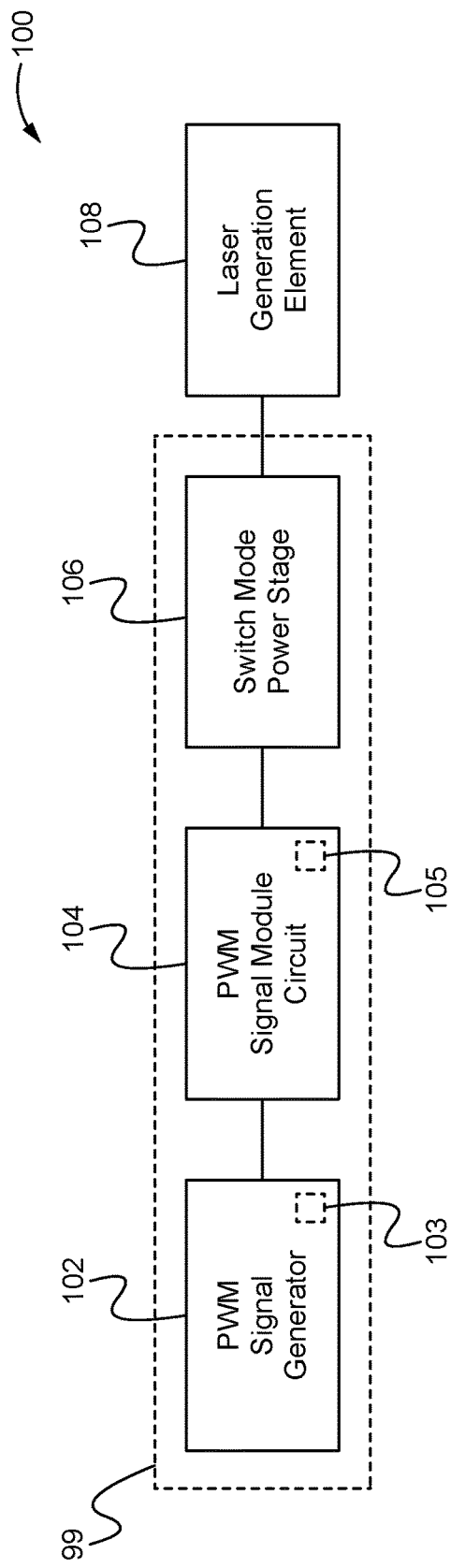
FIG. 1 illustrates a laser system according to some embodiments.

FIG. 1 illustrates a laser system 100 according to some embodiments. As shown in FIG. 1, the laser system 100 comprises a PWM signal generator 102, a PWM signal modification circuit 104, a switch mode power stage (SMPS) circuit 106 and a laser generation element 108, all electrically coupled together. Specifically, the signal generator 102, signal modification circuit 104 and the SMPS circuit 106 form a digital power circuit or digital power supply 99 that powers the laser generation element 108 such that the laser generation element 108 is able to generate laser light. The PWM signal generator 102 includes a clock element 103 having a clock speed and is able to comprise a controlling microchip, microprocessor or other type of circuit capable of outputting a width modulated square wave. The PWM signal modification circuit 104 is able to comprise one or more switches (e.g. transistors), capacitors and resistors (e.g. in the form of an RC circuit) and/or a selection element 105 (e.g. a microchip, microprocessor and/or multiplexor) configured to select a combination of the resistors and/or capacitors to be active at any one time. The SMPS circuit 106 is able to comprise a buck, boost, buck-boost, boost-buck, flyback, forward, half-bridge, full-bridge, push-pull and/or other types of SMPS circuits 106 able to be controlled by a PWM signal in order to convert an input voltage/current to a desired output voltage/current. The laser generation element 108 is able to comprise one or more (e.g. an array) of laser diodes and/or other types of laser light generation elements known in the art.

The PWM signal generator 102 is electrically coupled to the PWM signal modification circuit 104 and a controlling switch or switches (not shown) of the SMPS circuit 106 such that the PWM signal output by the PWM signal generator 102 and modified by the modification circuit 104 controls the switching and switching frequency of the SMPS circuit 106. The output of the SMPS circuit 106 is then output to the laser generation element 108 which uses the received voltage/current to operate (e.g. output a desired laser light). The PWM signal is generated by the PWM signal generator 102 using the clock 103 and as a result the minimum width modification (e.g. modification granularity) of the PWM signal is limited by the clock speed. However, the PWM signal modification circuit 104 is able to receive the output PWM signal and modify the timing of the rising and/or falling edge of each pulse (e.g. modify the pulse width) thereby reducing the minimum with modification possible to a level below that which was capable by the PWM signal generator 102 using the clock 103. Accordingly, the improved granularity of the pulse width control enables the system 100 to more accurately and efficiently control the voltage/current output by the SMPS circuit 106 to the laser generation element 108 and thereby better control the power supplied to the laser generation element 108. Additionally, it should be noted that the PWM signal generator 102, the PWM signal modification circuit 104, and the SMPS circuit 106 are each able to receive power from one or more power sources in order to operate, that have been omitted herein for the sake of brevity (e.g. two or more from the same source or each from separate sources).

Figure 2:
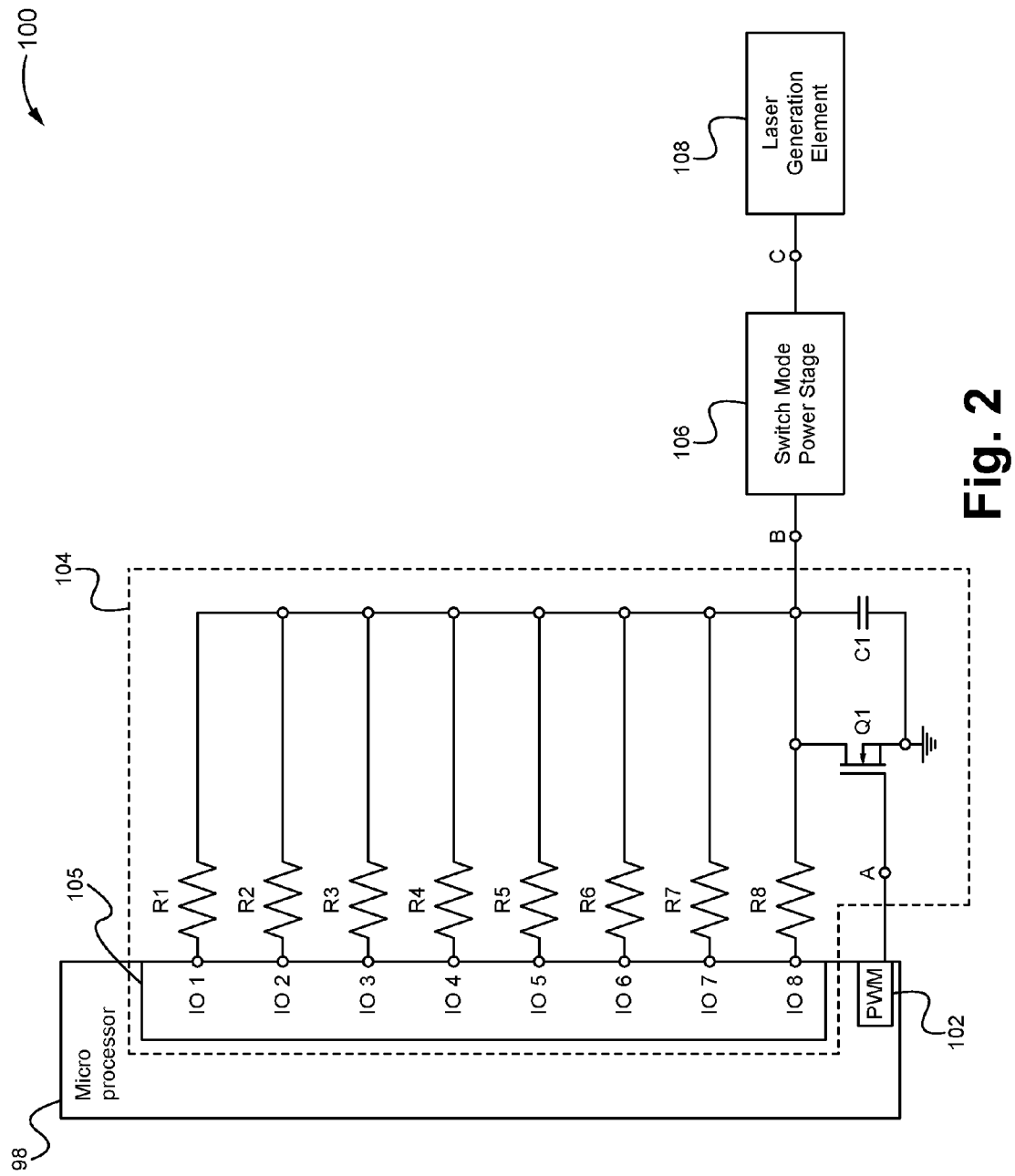
FIG. 2 illustrates a more detailed view of the laser system according to some embodiments.

FIG. 2 illustrates a more detailed view of the laser system 100 according to some embodiments. As shown in FIG. 2, the PWM modification circuit 104 is able to comprise an RC circuit including a computing element 98, the selection element 105, one or more resistors R1-R8, one or more capacitors C1 and one or more switches Q1 electrically coupled together. The industrial name for this circuit is commonly referred to as "R-2R DAC" or "R-2R digital to analog converter." The signal modifying circuit is able to be implemented with an equivalent R-2R DAC equivalent integrated circuit. Alternatively, the signal modification circuit is able to be embedded in the switch mode power stage. Specifically, each of the resistors R1-R8 is electrically coupled between an output of the selection element 105 (e.g. an I/O pin of the computing device 98) and a node B that is coupled to the input of the SMPS circuit 106. Similarly, the switch Q1 and the capacitor C1 are both electrically coupled between the node B and ground such that the switch Q1 and capacitor C1 are in parallel. Further, the output of the PWM signal generator 102 is electrically coupled to the gate of the switch Q1 at the node A. Finally, the output of the SMPS circuit 106 is coupled to the input of the laser generation element 108 at a node C.

Figure 3:
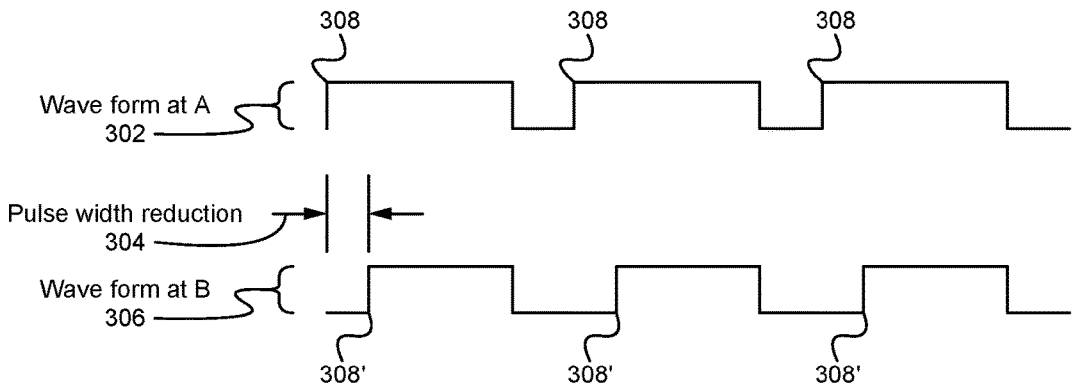
FIG. 3 illustrates a signal diagram illustrating exemplary waveforms at the nodes A and B of FIG. 2 according to some embodiments.

In operation, the PWM signal generator 102 outputs a PWM wave form 302 having a rising edge 308 at node A (as shown in FIG. 3) such that the switch Q1 is opened when the wave form 302 is low and is closed when the wave form 302 is high. Concurrently, the selection element 105 is able to select a combination of the resistors R1-R8 to turn on to logic high level thereby creating a desired equivalent resistance (based on the combination) at the node B. This equivalent resistance in conjunction with the capacitance of the capacitor C1 causes the voltage rise time (e.g. the rising edge 308' of the PWM signal) at the node B to be adjustably delayed by a time or width 304 with respect to the rising edge 308 of the waveform 302 at node A. As a result, a modified PWM wave form 306 (as shown in FIG. 3) is received by the SMPS circuit 106 at node B having a smaller pulse width due to the delayed rising edge 308' than the pulse width of the waveform 302 that was output by the PWM signal generator 102 at node A. Accordingly, the system 100 provides the benefit of enabling the pulse width to be reduced by a fraction of what is possible using the clock 103 of the PWM signal generator 102 thereby increasing the resolution or granularity of control over each pulse as received by the SMPS circuit 106.

The pulse width reduction amount is able to be determined by the equation:

$$\Delta t = [1 - e^{-(t/Rt1*C)}] - [1 - e^{-(t/Rt2*C)}]; \qquad 4)$$

where t is time, C is the capacitance of C1, Δt is the incremental reduction of the pulse width and Rt1, Rt2 are Thevenin equivalent resistances, respectively. Specifically, the addition of the RC circuit along with the remainder of the modification circuit 104 to the output of the PWM signal generator 102 finely divides the "on time" of the PWM from (n*Clock) as described in the background above to (n*Clock+Δt). For example, using an eight resistor network having resistance values that double in size, enables the selection element 105 to choose between 256 possible equivalent resistance values and therefore is able to effectively select between 256 more increments of time within one clock cycle of the clock 103. This in turn is able to change the smallest incremental change predicted by equation 2 above to (1/265)*n/m for any given n/m number of clock cycles, which in the above example results in 0.01 amps instead of the 3 amps described previously.

In some embodiments, each of the resistors R1-R8 have a different resistance value. For example, each resistor is able to have a value of a different factor of 2 (e.g. R, 2R, 4R, 8R, 16R, 32R, 64R, 128R). Alternatively, one or more of the resistors R1-R8 are able to have the same value. Alternatively or in addition, one or more of the resistors are able to be variable resistors.

Similarly, one or more of the capacitors are able to be a variable capacitance component. Further, although as shown in FIG. 2, the RC circuit includes eight resistors R1-R8, coupled to eight outputs (IO1-IO8) of the selection element 105 and a single capacitor C1, more or less resistors, outputs of the selection element 105 and/or capacitors are able to be used. For example, if multiple capacitors are used, the capacitance is able to be adjusted by selectively coupling/decoupling one or more of the capacitors from the node B using the selection element 105 and/or a different selection element. Indeed, in such an embodiment a single resistor is able to be used and instead of adjusting the rising edge timing based on changes in resistance of the RC circuit, the adjusting is able to be done by changing the capacitance. Additionally, although as shown in FIG. 2, a single computing element (e.g. microprocessor) is able to incorporate both the selection element 105 and the PWM signal generator 102, the selection element 105 and PWM signal generator 102 are able to be a part of separate computing elements.

Figure 4:
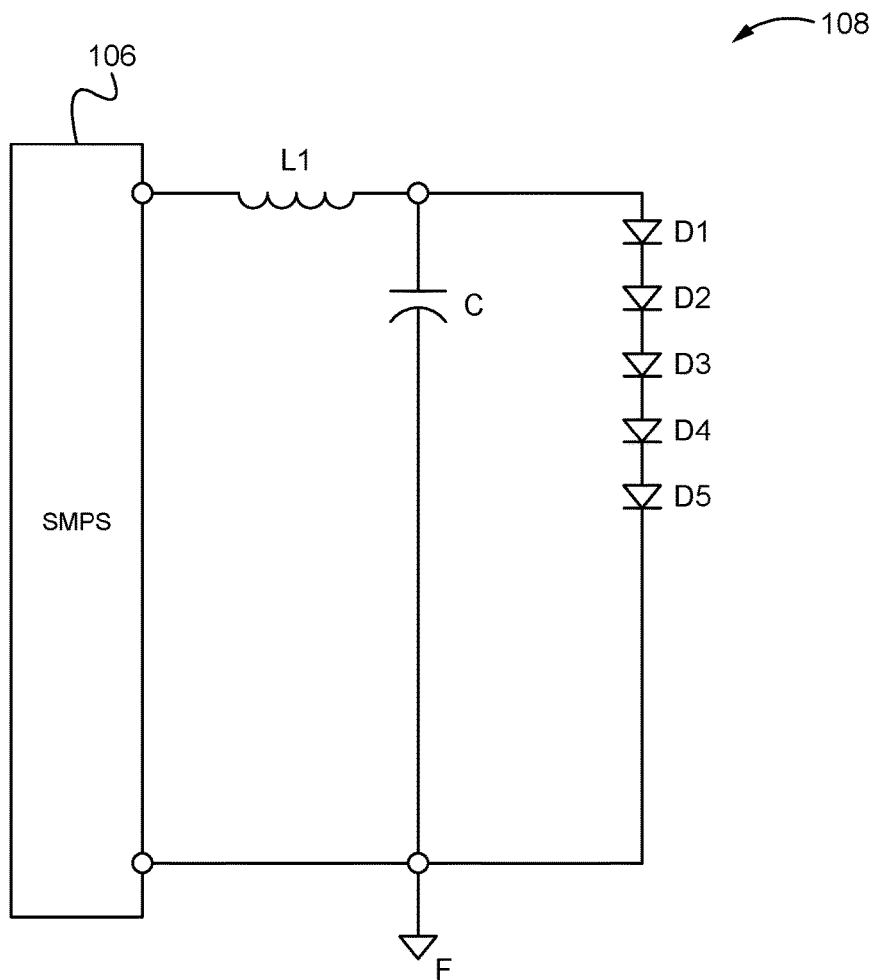
FIG. 4 illustrates a schematic circuit diagram of an exemplary laser generation element according to some embodiments.

FIG. 4 illustrates a schematic circuit diagram of an exemplary laser generation element 108 according to some embodiments. As shown in FIG. 4, the output of the SMPS circuit 106 is coupled to an LC circuit configured to function as an output filter. In particular, because of the increased granularity of pulse width control this output smoothing filter is able to be designed for optimum performance of the designed frequency within significantly smaller tolerances thereby reducing the size and increasing efficiency of the system 100. The output filter is electrically coupled to a series of laser diodes D1, D2, D3, D4, D5. Alternatively, one or more of the diodes are able to be replaced with light emitting diodes. As a result, when the laser diodes receive a current from the SMPS circuit 106 they output a desired laser light. Thus, the system 100 provides the benefit of a digital laser power supply with pico-second resolution and therefore greater efficiency and control granularity. Additionally, although the series of laser diodes shown in FIG. 4 includes five laser diodes, it is to be understood that the series of laser diodes is able to include more or less than five laser diodes.

Figure 5:
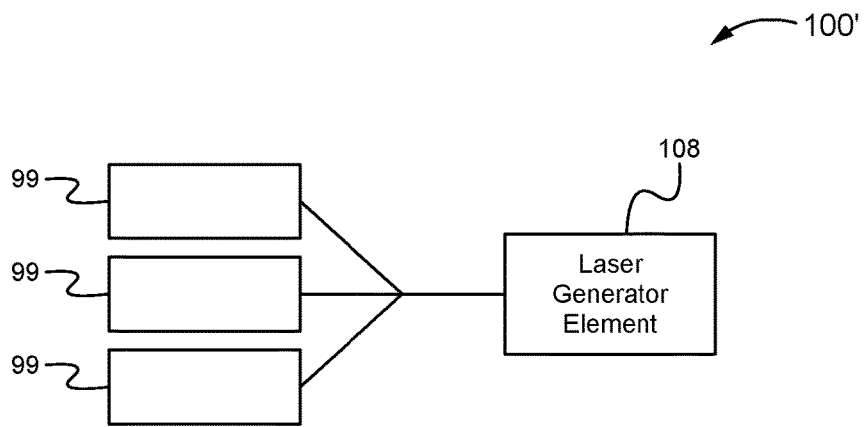
FIG. 5 illustrates a multi-powered laser system according to some embodiments.

FIG. 5 illustrates a multi-powered laser system 100' according to some embodiments. In particular, the system 100' is able to be substantially similar to the system 100 except that a plurality of power circuits 99, along with signal modification circuit, are all coupled in parallel to the laser generation element 108 to provide increased current to the laser generation element 108. Specifically, a major benefit of the vernier adjustment capability of the power circuit 99 described above is the ability to take advantage of the fact that current sources are able to be summed together to form a single output. In other words, by using two or more circuits 99 in parallel, it is possible to have a laser current controller that is two or more times higher in current (higher current rating). This is a major cost reduction over existing high current controllers because each unit 99 has a precisely measured output current (due to the increased granularity as described above) such that there is no need for an additional current servo to control the individual unit 99. Furthermore, the great expense of a high current sensor is eliminated altogether.

Figure 6:
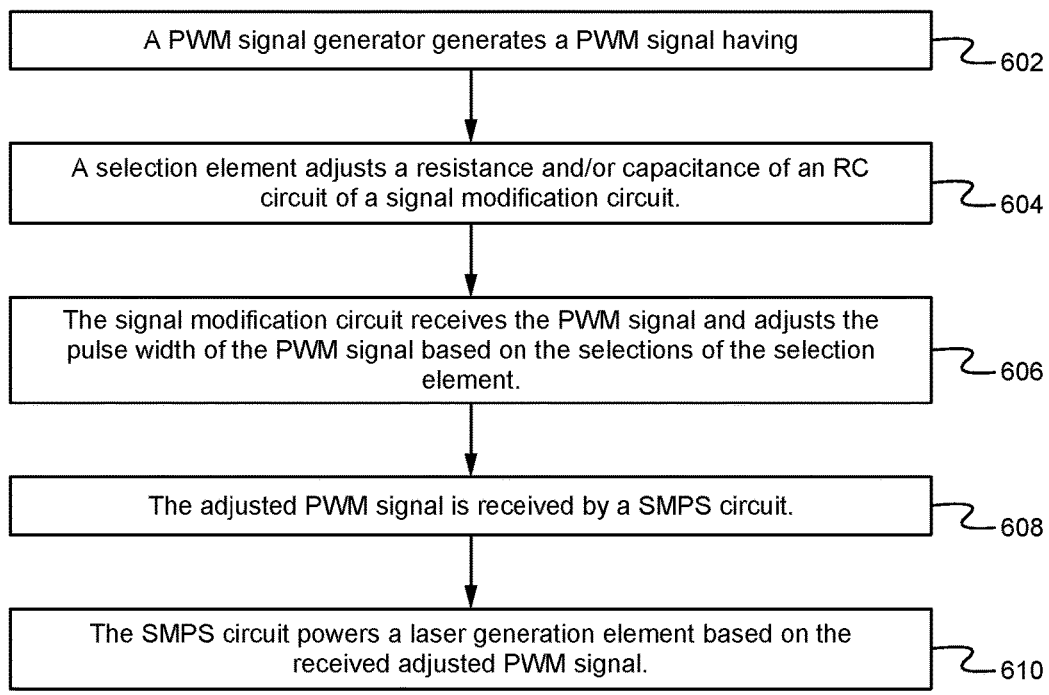
FIG. 6 illustrates a flow chart of a method of generating power for a laser system according to some embodiments.

FIG. 6 illustrates a flow chart of a method of generating power for a laser system 100 according to some embodiments. As shown in FIG. 6, a PWM signal generator 102 generates a PWM signal having a pulse width using a clock at the step 602. A selection element 105 adjusts a resistance and/or capacitance of an RC circuit of a signal modification circuit 104 at the step 604. In some embodiments, the adjusting comprises selecting and activating one or more of a plurality of resistors of the RC circuit and deactivating the remaining resistors. In some embodiments, the adjusting comprises selecting and coupling one or more of the plurality of capacitors of the RC circuit and decoupling the remaining capacitors. The signal modification circuit 104 receives the PWM signal and adjusts the pulse width of the PWM signal based on the selections of the selection element 105 at the step 606. In some embodiments, the PWM signal is adjusted by delaying the rising edge of each pulse thereby reducing the width of each pulse. The adjusted PWM signal is received by a SMPS 106 at the step 608. The SMPS 106 powers a laser generation element 108 based on the received adjusted PWM signal at the step 610. As a result, the method provides the advantage of increased granularity of pulse width control and therefore the system 100 as a whole. In some embodiments, the method further comprises providing and coupling a plurality of power circuits 99 to the laser generation elements 108, wherein steps 602-610 are performed in each power circuit 99.

The power supply circuit is described above as being applied to laser diodes and to a laser system. In other embodiments, the power supply circuit is applied to light emitting diodes. In general, the protection circuit can be applied to any type of diodes.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A laser system comprising:
    a laser generation element;
    a pulse width modulated (PWM) signal generator including a clock having a clock frequency, wherein the PWM signal generator uses the clock to generate a control signal having a period based on the clock frequency and including a pulse width between a rising edge and a falling edge;
    a switch mode power supply controlled by the control signal output by the PWM signal generator and electrically coupled to the laser generation element for providing power to the laser generation element based on the control signal; and a signal modification circuit electrically coupled with the PWM signal generator, wherein the signal modification circuit is configured to selectively delay the rising edge of each period of the control signal by one of one or more selectable durations thereby reducing the pulse width by a quantity, wherein the quantity is smaller than a minimum increment amount that the pulse width is able to change based on the clock frequency.

2. The laser system of claim 1, wherein the signal modification circuit comprises a resistor-capacitor (RC) circuit electrically coupled with a controller that is configured to selectively adjust at least one of the resistance and the capacitance of the RC circuit.

3. The laser system of claim 2, wherein the RC circuit comprises a plurality of resistors in parallel and the controller selectively adjusts the resistance by only providing power to a selected subset of the plurality of resistors.

4. The laser system of claim 3, wherein the RC circuit comprises a plurality of capacitors and the controller selectively adjust the capacitance by only electrically coupling a selected subset of the capacitors to the resistance.

5. The laser system of claim 4, wherein the PWM signal generator and the controller are integrated into a single microprocessor.

6. The laser system of claim 5, wherein the laser generation element is a plurality of laser diodes coupled in series, thereby forming a laser diode series.

7. The laser system of claim 6, wherein the PWM signal generator, the switch mode power supply and the signal modification circuit together form a power circuit having an output current, the laser system further comprising:

one or more additional power circuits that match the power circuit and each have a corresponding additional output current, wherein the output current and the additional output currents are all coupled in parallel and together provided to the to the laser generation element such that the current produced by the power circuit and the additional power circuits provided to the laser generation element is summed together.

8. The laser system of claim 2, wherein the signal modification circuit comprises a switch having a gate terminal, a source terminal and a drain terminal, wherein one or more capacitors of the RC circuit are electrically coupled in parallel with the switch between the source and drain terminals, one or more resistors of the RC circuit are electrically coupled in series with the switch via the source terminal, and the output of the PWM signal generator is coupled to the gate terminal of the switch.

9. A method of generating power for a laser system, the method comprising:

providing a laser generation element;

generating a control signal using a clock of a pulse width modulated (PWM) signal generator, the clock having a clock frequency and the control signal having a period based on the clock frequency and including a pulse width between a rising edge and a falling edge;

providing power to the laser generation element based on the control signal with a switch mode power supply controlled by the control signal output by the PWM signal generator and electrically coupled to the laser generation element; and selectively delaying the rising edge of each period of the control signal by one of one or more selectable durations thereby reducing the pulse width by a quantity with a signal modification circuit electrically coupled with the PWM signal generator, wherein the quantity is smaller than a minimum increment amount that the pulse width is able to change based on the clock frequency.

10. The method of claim 9, wherein the signal modification circuit comprises a resistor-capacitor (RC) circuit electrically coupled with a controller, the method further comprising selectively adjusting at least one of the resistance and the capacitance of the RC circuit with the controller.

11. The method of claim 10, wherein the RC circuit comprises a plurality of resistors in parallel, the method further comprising selectively adjusting the resistance with the controller by only providing power to a selected subset of the plurality of resistors.

12. The method of claim 11, wherein the RC circuit comprises a plurality of capacitors, the method further comprising selectively adjusting the capacitance with the controller by only electrically coupling a selected subset of the capacitors to the resistance.

13. The method of claim 12, wherein the PWM signal generator and the controller are integrated into a single microprocessor.

14. The method of claim 13, wherein the laser generation element is a plurality of laser diodes coupled in series, thereby forming a laser diode series.

15. The method of claim 14, wherein the PWM signal generator, the switch mode power supply and the signal modification circuit together form a power circuit having an output current, the method further comprising:

providing one or more additional power circuits that match the power circuit and each have a corresponding additional output current, wherein the output current and the additional output currents are all coupled in parallel; and providing all of the output currents to an input of the to the laser generation element such that the current produced by the power circuit and the additional power circuits provided to the laser generation element is summed together at the laser generation element and provides the summed current to the laser generation element.

16. The method of claim 10, wherein the signal modification circuit comprises a switch having a gate terminal, a source terminal and a drain terminal, wherein one or more capacitors of the RC circuit are electrically coupled in parallel with the switch between the source and drain terminals, one or more resistors of the RC circuit are electrically coupled in series with the switch via the source terminal, and the output of the PWM signal generator is coupled to the gate terminal of the switch.

17. A power circuit for powering a laser generator, the power circuit comprising:

a pulse width modulated (PWM) signal generator including a clock having a clock frequency, wherein the PWM signal generator uses the clock to generate a control signal having a period based on the clock frequency and including a pulse width between a rising edge and a falling edge; and a signal modification circuit electrically coupled with the PWM signal generator, wherein the signal modification circuit is configured to selectively delay the rising edge of each period of the control signal by one of one or more selectable durations thereby reducing the pulse width by a quantity, wherein the quantity is smaller than a minimum increment amount that the pulse width is able to change based on the clock frequency.

18. The power circuit of claim 17, wherein the signal modification circuit comprises a resistor-capacitor (RC) circuit electrically coupled with a controller that is configured to selectively adjust at least one of the resistance and the capacitance of the RC circuit.

19. The power circuit of claim 18, wherein the RC circuit comprises a plurality of resistors in parallel and the controller selectively adjusts the resistance by only providing power to a selected subset of the plurality of resistors.

20. The power circuit of claim 19, wherein the RC circuit comprises a plurality of capacitors and the controller selectively adjust the capacitance by only electrically coupling a selected subset of the capacitors to the resistance.

21. The power circuit of claim 20, wherein the PWM signal generator and the controller are integrated into a single microprocessor.

22. The power circuit of claim 21, wherein the PWM signal generator, the switch mode power supply and the signal modification circuit together form a power circuit having an output current, the laser system further comprising:
one or more additional power circuits that match the power circuit and each have a corresponding additional output current, wherein the output current and the additional output currents are all coupled in parallel such that the currents produced by the power circuit and the additional power circuits are summed together.

23. The power circuit of claim 18, wherein the signal modification circuit comprises a switch having a gate terminal, a source terminal and a drain terminal, wherein one or more capacitors of the RC circuit are electrically coupled in parallel with the switch between the source and drain terminals, one or more resistors of the RC circuit are electrically coupled in series with the switch via the source terminal, and the output of the PWM signal generator is coupled to the gate terminal of the switch.

\* \* \* \* \*